(12) United States Patent
Liu

(10) Patent No.: US 7,625,775 B2
(45) Date of Patent: Dec. 1, 2009

(54) MULTIPLE FUNCTION THIN-FILM RESISTOR-CAPACITOR ARRAY

(75) Inventor: Daniel Liu, Hsin-chu (TW)

(73) Assignee: Truelight Corporation, Hsin-Chu (TW)

(*) Notice: Subject to any disclaimer, the term of this patent is extended or adjusted under 35 U.S.C. 154(b) by 396 days.

(21) Appl. No.: 11/557,094

(22) Filed: Nov. 6, 2006

(65) Prior Publication Data

US 2008/0122034 A1 May 29, 2008

(51) Int. Cl.
*H01L 21/00* (2006.01)
(52) U.S. Cl. .............................. 438/65; 438/48; 438/66; 438/98; 257/E21.351
(58) Field of Classification Search ................... 438/48, 438/65, 66, 98; 257/E21.351
See application file for complete search history.

(56) References Cited

U.S. PATENT DOCUMENTS

2004/0188793 A1* 9/2004 Lindemann et al. ......... 257/457

* cited by examiner

*Primary Examiner*—George Fourson
*Assistant Examiner*—John M Parker
(74) *Attorney, Agent, or Firm*—Chun-Ming Shih

(57) ABSTRACT

A multiple function thin-film resistor-capacitor array is used for an optical fiber receiving module. A dielectric thin film with desired pattern and thickness is form on surface of a silicon substrate by semiconductor manufacture process. Resistors of different resistances and capacitors of different capacitances or the combination thereof, and circuit connection therebetween can be provided by controlling the thickness and shape of thin film. The thickness of the thin-film resistor-capacitor array is adjusted by grinding to provide a substrate of a photodiode. The photodiode can be die bonded to the resistor-capacitor array with desired optical position.

7 Claims, 6 Drawing Sheets

MULTIPLE FUNCTION THIN-FILM RESISTOR-CAPACITOR ARRAY

BACKGROUND OF THE INVENTION

1. Field of the Invention

The present invention relates to a multiple function thin-film resistor-capacitor array, especially to a multiple function thin-film passive element having resistors with different resistances and capacitors of different capacitances formed on a single silicon substrate and used as optical substrate.

2. Description of Prior Art

The package for optical fiber receiving module or semiconductor device might incorporate passive elements such as resistor or capacitor for voltage regulation or noise filtering.

FIGS. 1 and 2 show package and capacitor element for a prior art optical fiber receiving module 1. As shown in FIG. 1, the optical fiber receiving module 1 comprises a base 11, a photodiode 12, an optical substrate 13, and a transimpedance amplifier (TIA) 14. According to required resistance and capacitance, a resistor 15 and two single layer capacitors (SLC) 16, 16' are provided for voltage regulation or noise filtering. As to circuit connection for those elements, the photodiode 12 can be die bonded to the optical substrate 13 by silver epoxy and the position of the photodiode 12 can be adjusted by the thickness of the optical substrate 13. Afterward, the photodiode 12 is wire bonded and fixed to top face of the base 11 for TO-can architecture. Metal layers 162, 163 are added on surface of the dielectric layer 161 for the SLC 16 and 16'. The SLC can be integrated with the photodiode 12 by die bond and has electrical connection by wire bond. However, the capacitance value is affected by the thickness thereof. Therefore, the SLC cannot be used as optical substrate and the optical substrate 13 is additionally needed. The cost and processing time are increased.

FIGS. 3 to 5 show another prior art optical fiber receiving module 1. The optical fiber receiving module 1 comprises a base 11, a photodiode 12, an optical substrate 13, and a transimpedance amplifier (TIA) 14. According to required resistance and capacitance, an SMD resistor 17 and two SMD capacitors 18, 18' are provided for voltage regulation or noise filtering. As to circuit connection for those elements, the photodiode 12 can be die bonded to the optical substrate 13. However, wire bond cannot be performed on the surface of the SMD resistor 17 and the SMD capacitors 18, 18'. Moreover, the two electrodes are coplanar. The SMD devices are die bonded on the substrate 19 and then the electrodes thereof are electrically connected, as shown in FIGS. 3 and 4. One of the SMD capacitors 18, 18' can be arranged on the same optical substrate 13 with the photodiode 12 for circuit design and wire bonding. Afterward, those elements are electrically connected through wire bond, as shown in FIG. 5.

However, the prior art optical fiber receiving module 1 requires voltage regulator and filter unit composed of a plurality of resistors, capacitors, on an optical substrate. A plurality of die bond and wire bond processes are required for the photodiode 12. The cost is increased and the routing for the optical circuit and electrical circuit is limited. As the optical fiber receiving module becomes more compact, the device space is also limited because the SMD resistor and the SMD capacitor have their own standards. The position of the photodiode 12 is adjusted by the thickness of the optical substrate 13. The material cost is increase.

SUMMARY OF THE INVENTION the present invention is to provide a multiple function thin-film resistor-capacitor array, which can be easily defined by photo mask process, wherein resistors with different resistances and capacitors of different capacitances can be formed on a dielectric thin film on surface of single silicon substrate.

The present invention is to provide a multiple function thin-film resistor-capacitor array, wherein the thickness of the silicon substrate can be adjusted by grinding process to adjust the position of a photodiode.

Accordingly, the present invention provides a method for manufacturing a multiple function thin-film resistor-capacitor array, the thin-film resistor-capacitor array being used for voltage regulation and filtering for an optical fiber receiving module and used as an optical substrate, the optical fiber receiving module comprising a base, a photodiode and a transimpedance amplifier (TIA), the method comprising the steps of:

providing a silicon substrate;

forming a dielectric thin film on the silicon substrate;

forming a metal array layer with a plurality of resistors with different resistances and capacitors with different capacitances on the dielectric thin film by photolithography and photo mask grinding the silicon substrate to a desired thickness for an optical plane;

forming a contact of a gold pad on another face of the silicon substrate forming resistors of different resistances and forming capacitors of different capacitances on a single chip to finish the thin-film resistor-capacitor array.

Accordingly, the present invention provides an optical fiber receiving module using a multiple function thin-film resistor-capacitor array. The optical fiber receiving module comprises:

a base;

a multiple function thin-film resistor-capacitor array formed on a chip and comprising resistors of required resistances and capacitors of required capacitances, the thin-film resistor-capacitor array die bonded to one face of the base;

a photodiode die bonded to the multiple function thin-film resistor-capacitor array and the thickness of the multiple function thin-film resistor-capacitor array being adjusted to control the optical position of the photodiode;

a transimpedance amplifier (TIA) die bonded to one face of the base;

wherein the photodiode, the TIA, the resistors and capacitors of the thin-film resistor-capacitor array and terminals of the base are wire bonded to form connection therebetween.

BRIEF DESCRIPTION OF DRAWING

The features of the invention believed to be novel are set forth with particularity in the appended claims. The invention itself however may be best understood by reference to the following detailed description of the invention, which describes certain exemplary embodiments of the invention, taken in conjunction with the accompanying drawings in which:

DETAILED DESCRIPTION OF THE INVENTION

Figure 1:
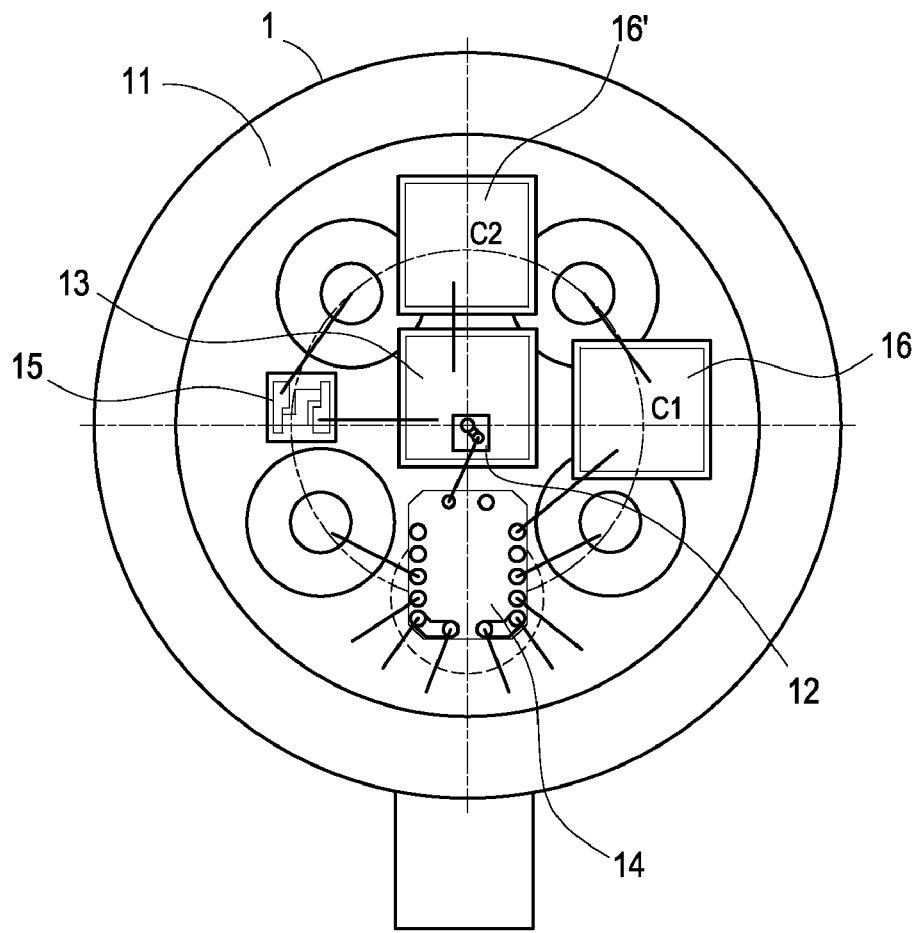
FIG. 1 shows a schematic view of a prior art optical fiber receiving module.
Figure 2:
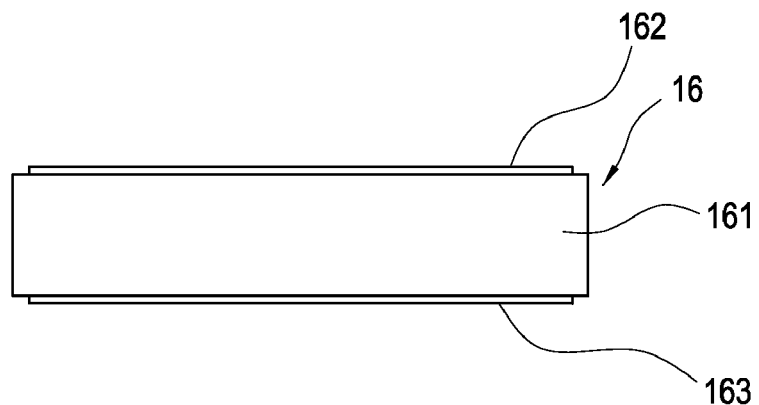
FIG. 2 shows a schematic view of capacitors used for a prior art optical fiber receiving module.
Figure 3:
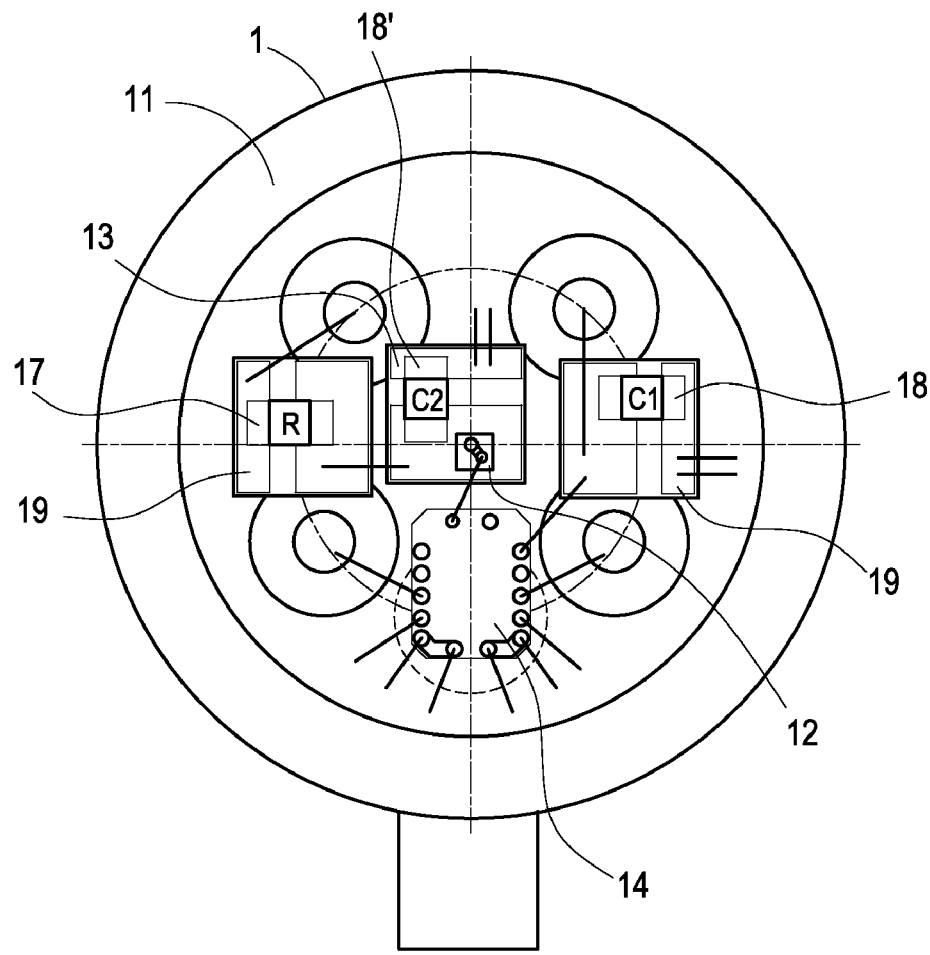
FIG. 3 shows a schematic view of another prior art optical fiber receiving module.
Figure 4:
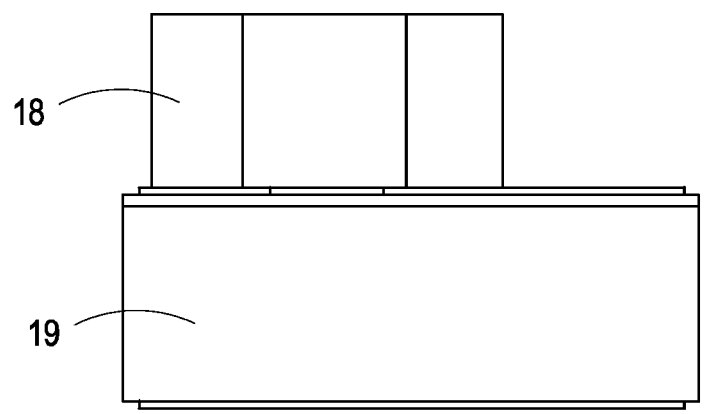
FIG. 4 shows a schematic view of capacitors used for another prior art optical fiber receiving module.
Figure 5:
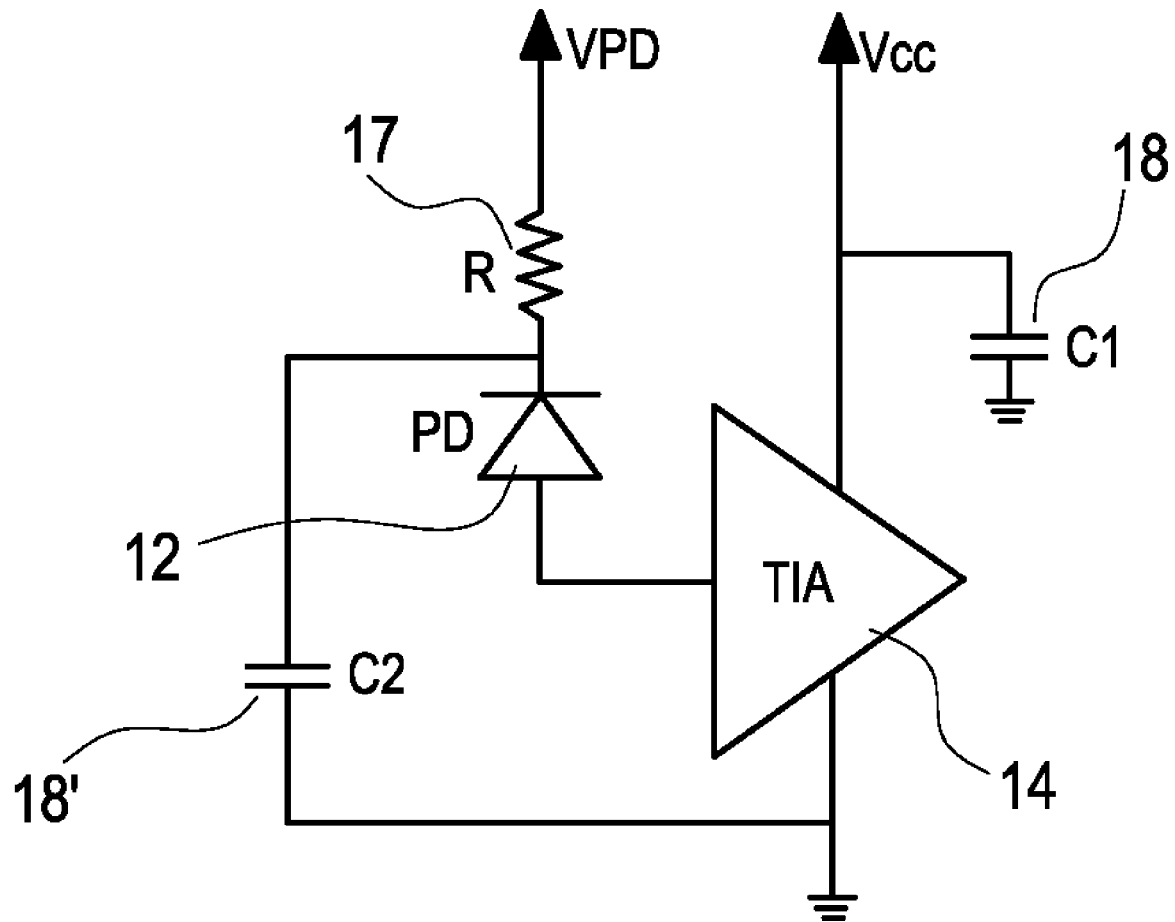
FIG. 5 shows the circuit diagram for another prior art optical fiber receiving module.
Figure 6:
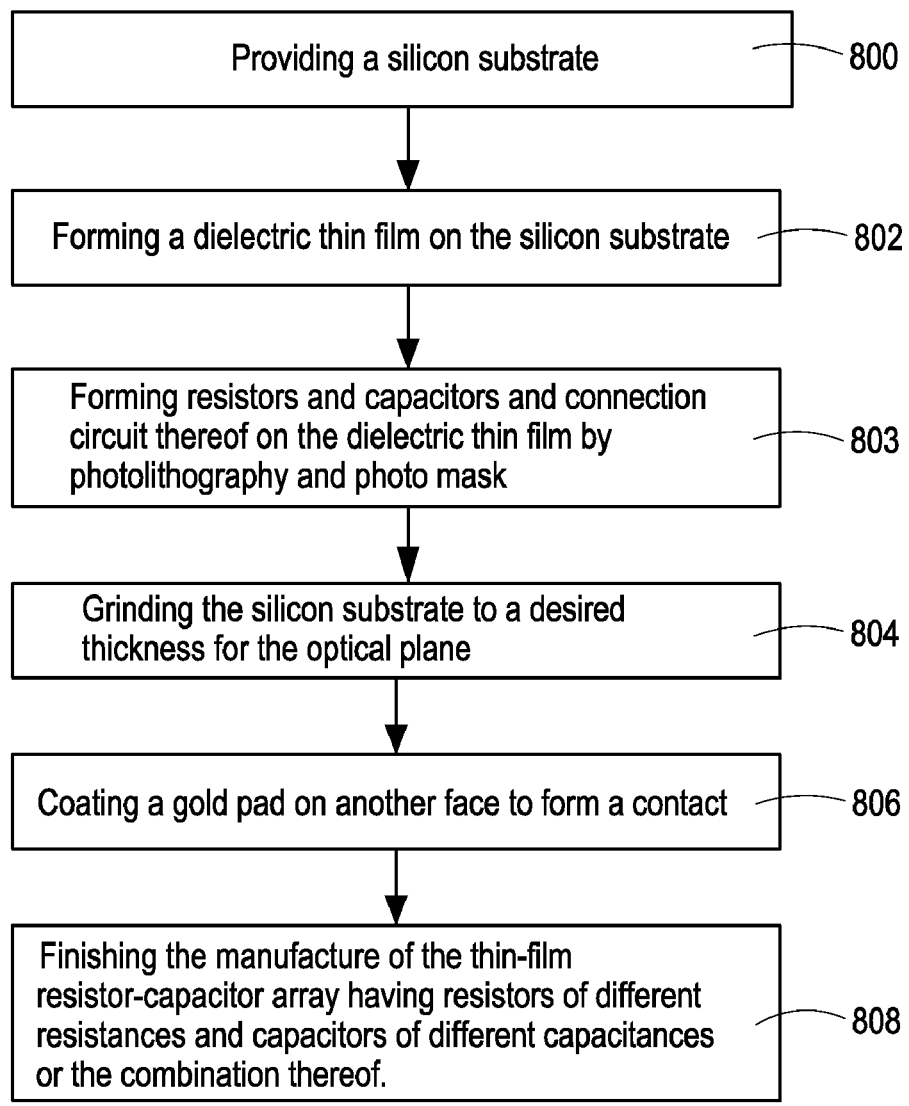
FIG. 6 shows a flowchart of the method according to a preferred embodiment the present invention.
Figure 7:
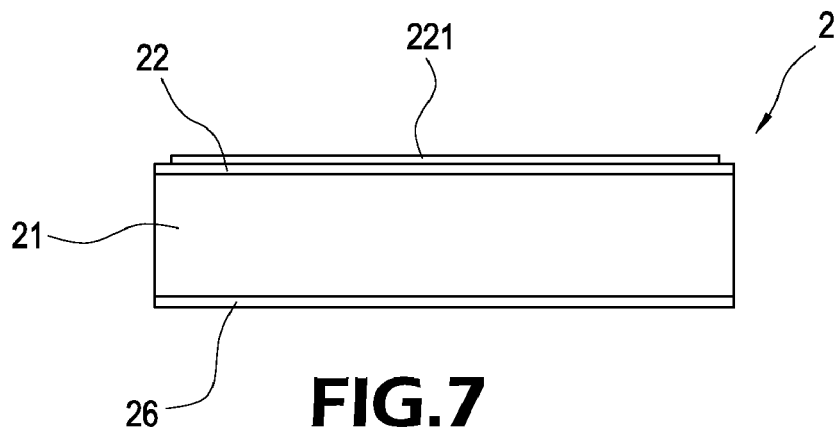
FIG. 7 shows a sectional view of a preferred embodiment of the present invention.

With reference to FIGS. 6 and 7, the method for manufacturing a multiple function thin-film resistor-capacitor array 2 according to the present invention comprises following steps:

Step 800: Providing a silicon substrate 21.

Step 802: Forming a dielectric thin film 22 on the silicon substrate 21, where the dielectric thin film 22 is one of silicon oxide or silicon nitride.

Step 803: Forming a metal array layer 221 with a plurality of resistors and capacitors on the dielectric thin film 22 by photolithography and photo mask, and forming connection circuit therebetween.

Step 804: Grinding the silicon substrate 21 to a desired thickness for the optical plane; alternatively, a silicon substrate 21 of desired thickness is selected, alternatively grinding the silicon substrate 21 by semiconductor manufacture process after the formation of resistor-capacitor array.

Step 806: Grinding another face of the silicon substrate 21 and then coating a gold pad 26 to form a contact; alternatively, die bonding by silvery epoxy to form contacts;

Step 808: Finishing the manufacture of the thin-film resistor-capacitor array 2, where resistors of different resistances and capacitors of different capacitances or the combination thereof are formed.

The resistances of the resistors and the capacitances of the capacitors on the dielectric thin film 22 depend on the thickness of the dielectric thin film 22 and the defined pattern. In other word, the metal array layer 221 can be formed with different shapes and sizes by using the photo mask, and the thickness of the dielectric thin film 22 can be controlled to form resistors of different resistances and forming capacitors of different capacitances on a single chip to finish the thin-film resistor-capacitor array 2. The circuit connection therebetween can also be formed by circuit trace.

Moreover, die bond and wire bond can be directly performed on the metal array layer 221 of the thin-film resistor-capacitor array 2 and contacts can also be formed on connected face thereof. The thin-film resistor-capacitor array 2 can be advantageously used for the optical fiber receiving module 3 and related products.

Figure 8:
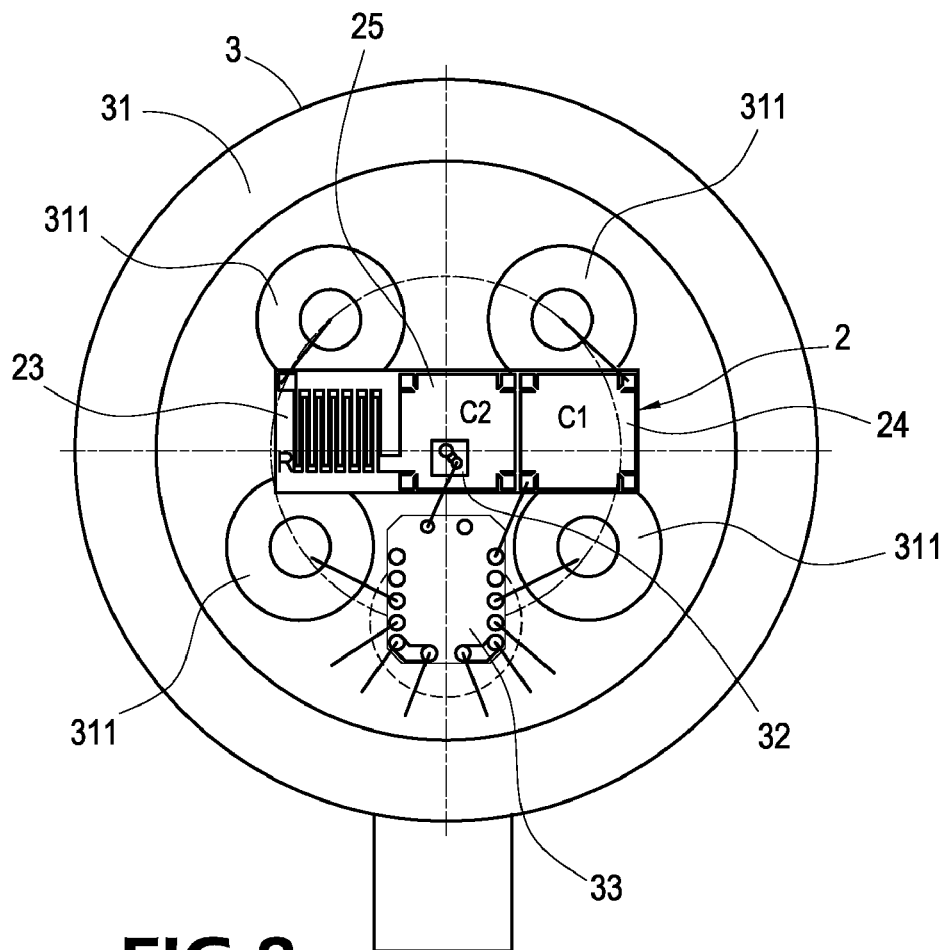
FIG. 8 shows a schematic view of the preferred embodiment of the present invention used for optical fiber receiving module.
Figure 9:
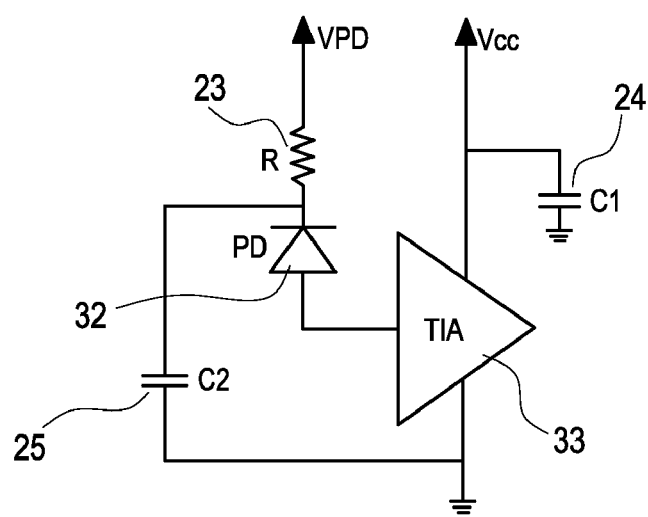
FIG. 9 shows the circuit diagram of the preferred embodiment of the present invention used for optical fiber receiving module.

FIGS. 8 and 9 show the optical fiber receiving module 3 using the thin-film resistor-capacitor array 2 according to a preferred embodiment of the present invention. The optical fiber receiving module 3 comprises a base 31 with a plurality of terminals 311, a thin-film resistor-capacitor array 2 according to the present invention, resistor 23 and capacitors 24 and 25 formed on single chip and bonded to surface of the base 31, a photodiode 32, and a transimpedance amplifier (TIA) 33, which are packaged in TO-can architecture.

The photodiode 32 is die bonded to a capacitor 25 of the thin-film resistor-capacitor array 2 by silvery epoxy. In other word, the thin-film resistor-capacitor array 2 replaces the conventional optical substrate to function as the substrate of the photodiode 32. The thickness of the thin-film resistor-capacitor array 2 can be adjusted by grinding to match the desired position of the photodiode 32. As shown in FIG. 9, the photodiode 32, the TIA 33, the resistor 23 and capacitors 24 and 25 on the thin-film resistor-capacitor array 2, and the terminals 311 of the base 31 are connected by wire bond process.

Figure 10:
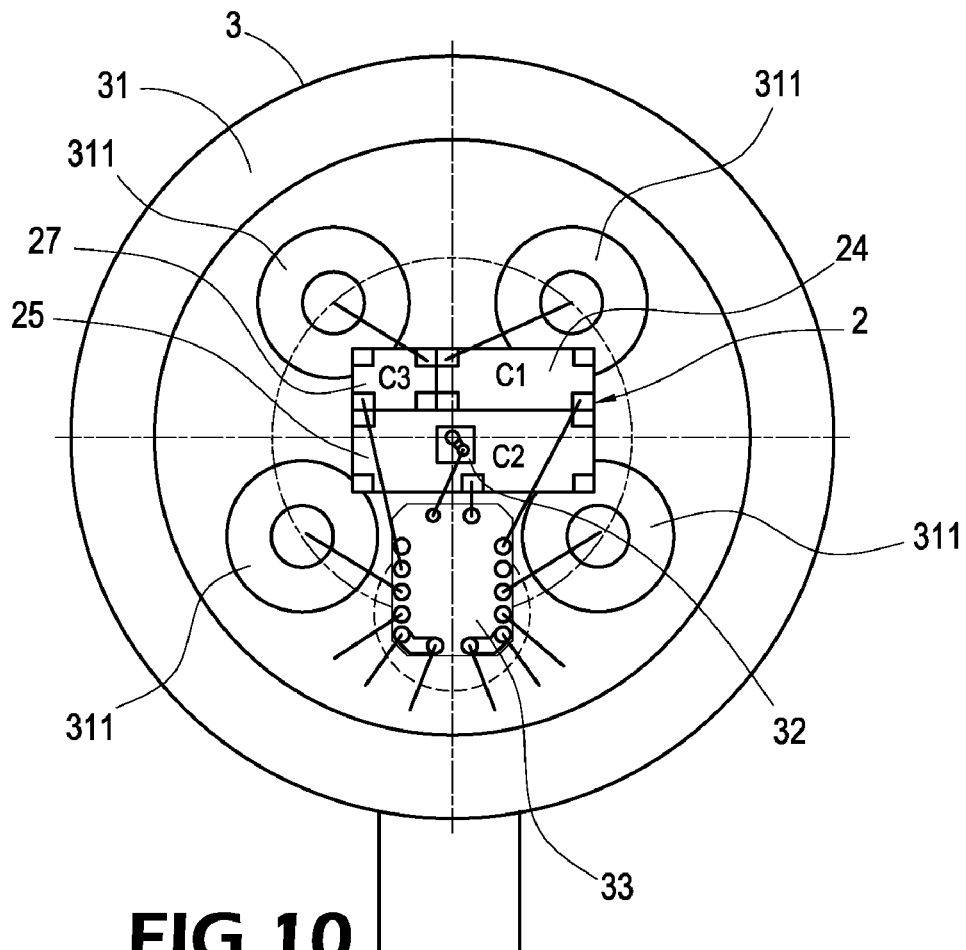
FIG. 10 shows a schematic view of another preferred embodiment of the present invention used for optical fiber receiving module.
Figure 11:
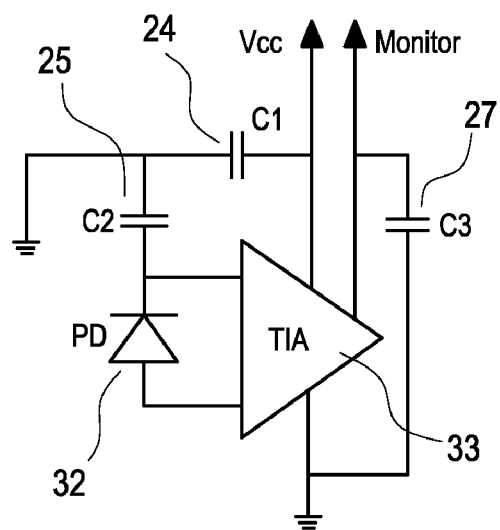
FIG. 11 shows the circuit diagram of another preferred embodiment of the present invention used for optical fiber receiving module.

FIGS. 10 and 11 show thin-film resistor-capacitor array 2 according to another preferred embodiment of the present invention. This preferred embodiment is similar to that shown in FIGS. 8 and 9 except that the thin-film resistor-capacitor array 2 in this preferred embodiment comprises composition of capacitors 24, 25 and 27 of different capacitances. The photodiode 32 is die bonded to the capacitor 25 of the thin-film resistor-capacitor array 2. The desired height of the photodiode 32 is adjusted by the thickness of the multiple-function thin-film resistor-capacitor array 2. The photodiode 32, the TIA 33, the resistor 23 and capacitors 24 and 25 in the thin-film resistor-capacitor array 2, and the terminals 311 of the base 31 are connected by wire bond process, as shown in FIG. 11.

The multiple-function thin-film resistor-capacitor array 2 for the optical fiber receiving module 3 according to the present invention has following advantages:

(a). Resistors of different resistances and capacitors of different capacitances, or the combination thereof can be formed by adjusting pattern and thickness of dielectric layer through semiconductor process.

(b). Low material consumption and cost.

(c). Multiple passive elements in single chip to reduce die bond process times.

(d). The resistor and the capacitor can be connected through photo mask circuit design to reduce wire bond process times.

(e). The thickness of silicone substrate can be adjusted through grinding process, or a chip with desired thickness can be used, or the silicone substrate with resistor-capacitor array pattern can be grinded to desired thickness, whereby the resistor-capacitor array is not affected.

(f). The processes for chip bond and wire bond are easy, it is benefic for the application of optical fiber receiving module and related product.

Although the present invention has been described with reference to the preferred embodiment thereof, it will be understood that the invention is not limited to the details thereof. Various substitutions and modifications have suggested in the foregoing description, and other will occur to those of ordinary skill in the art. Therefore, all such substitutions and modifications are intended to be embraced within the scope of the invention as defined in the appended claims.

What is claimed is:

1. A method for manufacturing a multiple function thin-film resistor-capacitor array, the thin-film resistor-capacitor array being used for voltage regulation and filtering for an optical fiber receiving module and used as an optical substrate, the optical fiber receiving module comprising a base, a photodiode and a transimpedance amplifier (TIA), the method comprising the steps of:

a). providing a silicon substrate;

b). forming a dielectric thin film on the silicon substrate;

c). forming a metal array layer with resistors of different resistances and capacitors with different capacitances on the dielectric thin film by photolithography and photo mask, and circuit connection therebetween;

d). grinding the silicon substrate to a desired thickness for an optical plane;

e). die bonding a photodiode to the thin-film resistor-capacitor array with the desired optical plane for the photodiode; and f). finishing the manufacture of the thin-film resistor-capacitor array, where resistors of different resistances and capacitors of different capacitances or the combination thereof are formed.

2. The method as in claim 1, further comprising:

coating a gold pad on another face of the silicon Substrate to form a contact.

3. The method as in claim 1, further comprising:

grinding another face of the silicon substrate to adjust the thickness and then coating a gold pad to form a contact.

4. The method as in claim 1, further comprising:

forming a contact on another face of the silicon substrate by silvery epoxy.

5. The method as in claim 1, further comprising:

determining resistance of the resistors and capacitance of capacitors on the silicon substrate by controlling a thickness of the dielectric thin film and a pattern of the dielectric thin film.

6. The method as in claim 1, further comprising:

forming circuit connection between the resistors and capacitors on the silicon substrate by pattern of photomask.

7. The method as in claim 1, further comprising:

selecting the silicon substrate with a thickness according to a required thickness of optical plane.

* * * * *